(12) United States Patent
Kato et al.

(10) Patent No.: US 6,421,268 B2
(45) Date of Patent: Jul. 16, 2002

(54) METHOD FOR DRIVING SEMICONDUCTOR MEMORY

(75) Inventors: Yoshihisa Kato, Shiga; Yasuhiro Shimada, Kyoto, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/899,839

(22) Filed: Jul. 9, 2001

(30) Foreign Application Priority Data

Jul. 13, 2000 (JP) ....................... 2000-212357

(51) Int. Cl.[7] .............................................. G11C 11/22
(52) U.S. Cl. ........................................ 365/145; 365/149
(58) Field of Search .......................... 365/145, 189.06, 365/149, 189.08

(56) References Cited

U.S. PATENT DOCUMENTS

| | | | | |
|---|---|---|---|---|
| 5,621,680 A | * | 4/1997 | Newman et al. | 365/145 |
| 5,689,456 A | * | 11/1997 | Kobayashi | 257/295 |
| 5,886,920 A | * | 3/1999 | Marshall et al. | 365/145 |
| 5,912,835 A | * | 6/1999 | Katoh | 365/145 |
| 6,292,386 B1 | * | 9/2001 | Honigschmid | 365/145 |

FOREIGN PATENT DOCUMENTS

| JP | 11-177036 | 7/1999 |
|---|---|---|
| JP | 2000-22010 | 1/2000 |

* cited by examiner

*Primary Examiner*—Richard Elms
*Assistant Examiner*—Hien Nguyen
(74) *Attorney, Agent, or Firm*—Nixon Peabody LLP; Donald R. Studebaker

(57) ABSTRACT

A multi-valued data is written in a ferroelectric capacitor, which stores a multi-valued data in accordance with displacement of polarization of a ferroelectric film thereof, by applying a relatively high first writing voltage or a relatively low second writing voltage between a first electrode and a second electrode of the ferroelectric capacitor. Next, a potential difference induced between the first and second electrodes is removed. Then, the multi-valued data is read by detecting the displacement of the polarization of the ferroelectric film by applying a reading voltage between the second electrode and a substrate where a reading FET for detecting the displacement of the polarization of the ferroelectric film is formed. The reading voltage has the same polarity as the first writing voltage and is set to such magnitude that, in applying the reading voltage, a first potential difference induced between the gate electrode of the reading FET and the substrate when the multi-valued data is written by applying the first writing voltage is smaller than a second potential difference induced between the gate electrode and the substrate when the multi-valued data is written by applying the second writing voltage.

6 Claims, 5 Drawing Sheets

METHOD FOR DRIVING SEMICONDUCTOR MEMORY

BACKGROUND OF THE INVENTION

The present invention relates to a method for driving a semiconductor memory including a ferroelectric capacitor.

A known semiconductor memory including a ferroelectric capacitor is composed of, as shown in FIG. 6, a field effect transistor (hereinafter referred to as the FET) 1 having a drain region 1a, a source region 1b and a gate electrode 1c, and a ferroelectric capacitor 2 having an upper electrode 2a, a lower electrode 2b and a ferroelectric film 2c. This semiconductor memory employs the non-destructive readout system in which the lower electrode 2b of the ferroelectric capacitor 2 is connected to the gate electrode 1c of the FET 1, so as to use the ferroelectric capacitor 2 for controlling the gate potential of the FET 1. In FIG. 6, a reference numeral 3 denotes a substrate.

In writing a data in this semiconductor memory, a writing voltage is applied between the upper electrode 2a of the ferroelectric capacitor 2, which works as a control electrode, and the substrate 3.

For example, when a data is written by applying a voltage (control voltage) positive with respect to the substrate 3 to the upper electrode 2a, downward polarization is caused in the ferroelectric film 2c of the ferroelectric capacitor 2. Thereafter, even when the upper electrode 2a is grounded, positive charge remains in the gate electrode 1c of the FET 1, and hence, the gate electrode 1c has positive potential.

When the potential of the gate electrode 1c exceeds the threshold voltage of the FET 1, the FET 1 is in an on-state. Therefore, when a potential difference is induced between the drain region 1a and the source region 1b, a current flows between the drain region 1a and the source region 1b. Such a logical state of the ferroelectric memory is defined, for example, as "1".

On the other hand, when a voltage negative with respect to the substrate 3 is applied to the upper electrode 2a of the ferroelectric capacitor 2, upward polarization is caused in the ferroelectric film 2c of the ferroelectric capacitor 2. Thereafter, even when the upper electrode 2a is grounded, negative charge remains in the gate electrode 1c of the FET 1, and hence, the gate electrode 1c has negative potential. In this case, the potential of the gate electrode 1c is always lower than the threshold voltage of the FET 1, the FET 1 is in an off-state. Therefore, even when a potential difference is induced between the drain region 1a and the source region 1b, no current flows between the drain region 1a and the source region 1b. Such a logical state of the ferroelectric memory is defined, for example, as "0".

Even when the power supply to the ferroelectric capacitor 2 is shut off, namely, even when the voltage application to the upper electrode 2a of the ferroelectric capacitor 2 is stopped, the aforementioned logical states are retained, and thus, a nonvolatile memory is realized. Specifically, when power is supplied again to apply a voltage between the drain region 1a and the source region 1c after shutting off the power supply for a given period of time, a current flows between the drain region 1a and the source region 1b if the logical state is "1", so that the data "1" can be read, and no current flows between the drain region 1a and the source region 1b if the logical state is "0", so that the data "0" can be read.

In order to correctly retain a data while the power is being shut off (which characteristic for retaining a data is designated as retention), it is necessary to always keep the potential of the gate electrode 1c of the FET 1 to be higher than the threshold voltage of the FET 1 when the data is "1" and to always keep the potential of the gate electrode 1c of the FET 1 at a negative voltage when the data is "0".

While the power is being shut off, the upper electrode 2a of the ferroelectric capacitor 2 and the substrate 3 have ground potential, and hence, the potential of the gate electrode 1c is isolated. Therefore, ideally, as shown in FIG. 7, a first intersection c between a hysteresis loop 4 obtained in writing a data in the ferroelectric capacitor 2 and a gate capacitance load line 7 of the FET 1 obtained when a bias voltage is 0 V corresponds to the potential of the gate electrode 1c obtained in storing a data "1", and a second intersection d between the hysteresis loop 4 and the gate capacitance load line 7 corresponds to the potential of the gate electrode 1c obtained in storing a data "0". In FIG. 7, the ordinate indicates charge Q appearing in the upper electrode 2a (or the gate electrode 1c) and the abscissa indicates voltage V.

Actually, however, the ferroelectric capacitor 2 is not an ideal insulator but has a resistance component, and hence, the potential of the gate electrode 1c drops through the resistance component. This potential drop is exponential and has a time constant obtained by multiplying parallel combined capacitance of the gate capacitance of the FET 1 and the capacitance of the ferroelectric capacitor 2 by the resistance component of the ferroelectric capacitor 2. The time constant is approximately $10^4$ seconds at most. Accordingly, the potential of the gate electrode 1c is halved within several hours.

Since the potential of the gate electrode 1c is approximately 1 V at the first intersection c as shown in FIG. 7, when the potential is halved, the potential of the gate electrode 1c becomes approximately 0.5 V, which is lower than the threshold voltage of the FET 1 (generally of approximately 0.7 V). As a result, the FET 1 that should be in an on-state is turned off in a short period of time.

In this manner, although the ferroelectric memory using the ferroelectric capacitor for controlling the gate potential of the FET has an advantage that a rewrite operation is not necessary after a data read operation, it has the following problem: The gate electrode 1a of the FET 1 obtains potential after writing a data, and the ability for keeping the gate potential determines the retention characteristic. Since the time constant until discharge of the ferroelectric capacitor 2 is short due to the resistance component of the ferroelectric capacitor 2, the data retaining ability is short, namely, the retention characteristic is not good.

SUMMARY OF THE INVENTION

In consideration of the aforementioned conventional problem, an object of the invention is improving the retention characteristic of a semiconductor memory including a ferroelectric capacitor for storing a multi-valued data in accordance with displacement of polarization of a ferroelectric film thereof.

In order to achieve the object, the first method of this invention for driving a semiconductor memory including a ferroelectric capacitor for storing a multi-valued data in accordance with displacement of polarization of a ferroelectric film thereof and a reading field effect transistor that is formed on a substrate and has a gate electrode connected to a first electrode corresponding to one of an upper electrode and a lower electrode of the ferroelectric capacitor for detecting the displacement of the polarization of the ferroelectric film, comprises a first step of writing a multi-valued data in the ferroelectric capacitor by applying a relatively high first writing voltage or a relatively low second writing voltage between the first electrode and a second electrode corresponding to the other of the upper electrode and the lower electrode of the ferroelectric capacitor; a second step of removing a potential difference induced between the first electrode and the second electrode; and a third step of reading the multi-valued data by detecting the displacement of the polarization of the ferroelectric film by applying a reading voltage between the second electrode and the substrate, and the reading voltage has the same polarity as the first writing voltage and is set to such magnitude that, in applying the reading voltage, a first potential difference induced between the gate electrode and the substrate when the multi-valued data is written by applying the first writing voltage is smaller than a second potential difference induced between the gate electrode and the substrate when the multi-valued data is written by applying the second writing voltage.

In the first method for driving a semiconductor memory of this invention, after writing a multi-valued data in the ferroelectric capacitor, the potential difference induced between the first electrode and the second electrode of the ferroelectric capacitor is removed. Therefore, lowering of the potential of the gate electrode through a resistance component of the ferroelectric film due to the potential difference induced in the ferroelectric capacitor can be avoided, resulting in improving the retention characteristic while the power is being shut off.

In this case, the potential difference induced between the first electrode and the second electrode of the ferroelectric capacitor is removed. However, since the reading voltage has the same polarity as the first writing voltage and is set to such magnitude that, in applying the reading voltage, the first potential difference induced between the gate electrode and the substrate when the multi-valued data is written by applying the first writing voltage is smaller than the second potential difference induced between the gate electrode and the substrate when the multi-valued data is written by applying the second writing voltage, the data stored in the ferroelectric capacitor can be read without fail.

In the first method for driving a semiconductor memory, the semiconductor memory preferably has a switch for equalizing potentials of the first electrode and the second electrode of the ferroelectric capacitor, and the second step preferably includes a sub-step of removing the potential difference by equalizing the potentials of the first electrode and the second electrode with the switch.

In this manner, the potential difference induced between the first electrode and the second electrode of the ferroelectric capacitor can be easily and definitely removed.

In the first method for driving a semiconductor memory, the third step preferably includes a sub-step of detecting the displacement of the polarization of the ferroelectric film by detecting whether a potential difference induced between the gate electrode and the substrate owing to division of the reading voltage in accordance with a ratio between capacitance of the ferroelectric capacitor and gate capacitance of the reading field effect transistor is relatively high or relatively low.

In this manner, the potential difference induced between the gate electrode and the substrate can be set to satisfy the aforementioned relationship, namely, the relationship in which the first potential difference induced between the gate electrode and the substrate when the multi-valued data is written by applying the relatively high first writing voltage is smaller than the potential difference induced between the gate electrode and the substrate when the multi-valued data is written by applying the relatively low second writing voltage.

The second method of this invention for driving a semiconductor memory including a plurality of successively connected ferroelectric capacitors each for storing a multi-valued data in accordance with displacement of polarization of a ferroelectric film thereof, and a reading field effect transistor that is formed on a substrate and has a gate electrode connected to one end of the plurality of successively connected ferroelectric capacitors for detecting the displacement of the polarization of the ferroelectric film of each of the successively connected ferroelectric capacitors, comprises a first step of writing a multi-valued data in one ferroelectric capacitor selected from the plurality of ferroelectric capacitors by applying a relatively high first writing voltage or a relatively low second writing voltage between an upper electrode and a lower electrode of the selected ferroelectric capacitor; a second step of removing a potential difference induced between the upper electrode and the lower electrode of the selected ferroelectric capacitor; and a third step of reading the multi-valued data by detecting the displacement of the polarization of the ferroelectric film of the selected ferroelectric capacitor by applying a reading voltage between another end of the plurality of successively connected ferroelectric capacitors and the substrate, and the reading voltage has the same polarity as the first writing voltage and is set to such magnitude that, in applying the reading voltage, a first potential difference induced between the gate electrode and the substrate when the multi-valued data is written by applying the first writing voltage is smaller than a second potential difference induced between the gate electrode and the substrate when the multi-valued data is written by applying the second writing voltage.

In the second method for driving a semiconductor memory of this invention, after writing a multi-valued data in the ferroelectric capacitor, the potential difference induced between the upper electrode and the lower electrode of the ferroelectric capacitor is removed. Therefore, the lowering of the potential of the gate electrode through the resistance component of the ferroelectric film due to the potential difference induced in the ferroelectric capacitor can be avoided, resulting in improving the retention characteristic while the power is being shut off.

In this case, the potential difference induced between the upper electrode and the lower electrode of the ferroelectric capacitor is removed. However, since the reading voltage has the same polarity as the first writing voltage and is set to such magnitude that, in applying the reading voltage, the first potential difference induced between the gate electrode and the substrate when the multi-valued data is written by applying the first writing voltage is smaller than the second potential difference induced between the gate electrode and the substrate when the multi-valued data is written by applying the second writing voltage, the data stored in the ferroelectric capacitor can be read without fail.

In the second method for driving a semiconductor memory, the semiconductor memory preferably has a plurality of switches each for equalizing potentials of an upper electrode and a lower electrode of each of the plurality of ferroelectric capacitors, and the second step preferably includes a sub-step of removing the potential difference by equalizing the potentials of the upper electrode and the lower electrode of the selected ferroelectric capacitor with the switch.

In this manner, the potential difference induced between the upper electrode and the lower electrode of the ferroelectric capacitor can be easily and definitely removed.

In the second method for driving a semiconductor memory, the third step preferably includes a sub-step of detecting the displacement of the polarization of the ferroelectric film of the selected ferroelectric capacitor by detecting whether a potential difference induced between the gate electrode and the substrate owing to division of the reading voltage in accordance with a ratio between capacitance of the selected ferroelectric capacitor and gate capacitance of the reading field effect transistor is relatively high or relatively low.

In this manner, the potential difference induced between the gate electrode and the substrate can be set to satisfy the aforementioned relationship, namely, the relationship in which the first potential difference induced between the gate electrode and the substrate when the multi-valued data is written by applying the relatively high first writing voltage is smaller than the potential difference induced between the gate electrode and the substrate when the multi-valued data is written by applying the relatively low second writing voltage.

DETAILED DESCRIPTION OF THE INVENTION

Embodiment 1

A semiconductor memory and a method for driving the semiconductor memory according to Embodiment 1 of the invention will now be described with reference to FIGS. 1 through 4.

Figure 1:
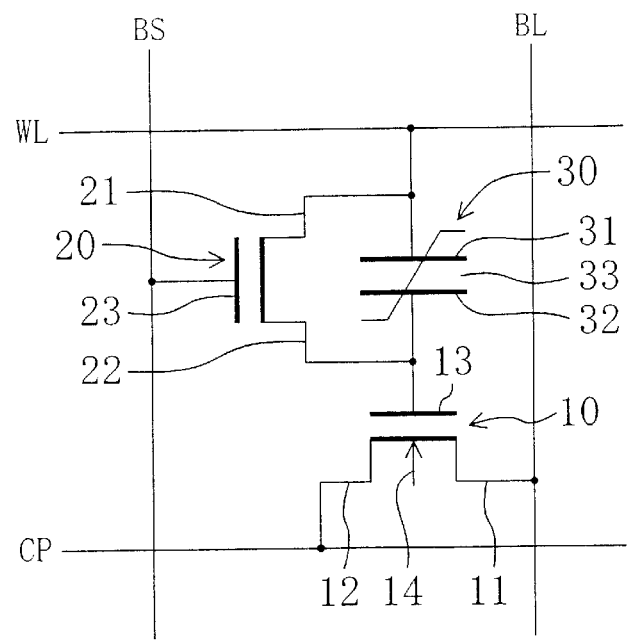
FIG. 1 is an equivalent circuit diagram of a memory cell included in a semiconductor memory according to Embodiment 1 of the invention.

FIG. 1 shows the equivalent circuit of a memory cell included in the semiconductor memory of Embodiment 1. The semiconductor memory of this embodiment includes a reading FET 10 having a drain region 11, a source region 12 and a gate electrode 13, a selecting FET 20 having a drain region 21, a source region 22 and a gate electrode 23, and a ferroelectric capacitor 30 having an upper electrode 31, a lower electrode 32 and a ferroelectric film 33. The reading FET 10, the selecting FET 20 and the ferroelectric capacitor 30 together form the memory cell.

The lower electrode 32 of the ferroelectric capacitor 30 is connected to the gate electrode 13 of the reading FET 10 and the source region 22 of the selecting FET 20, and the upper electrode 31 of the ferroelectric capacitor 30 is connected to the drain region 21 of the selecting FET 20 and a word line WL. The drain region 11 of the reading FET 10 is connected to a bit line BL, the source region 12 of the reading FET 10 is connected to a plate line CP, and the gate electrode 23 of the selecting FET 20 is connected to a control line BS. In FIG. 1, a reference numeral 14 denotes a substrate where the reading FET 10 is formed.

Figure 2:
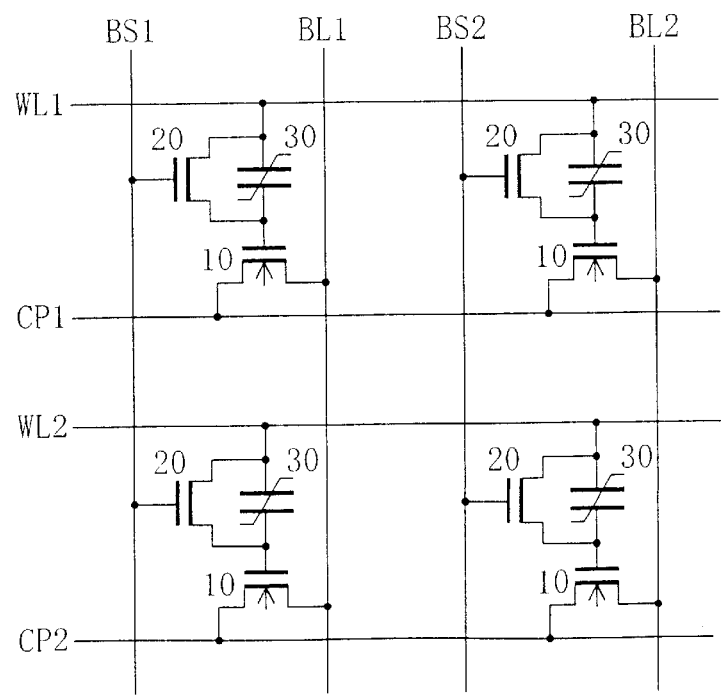
FIG. 2 is an equivalent circuit diagram of a memory cell array in which memory cells each included in the semiconductor memory of Embodiment 1 are arranged in the form of a matrix.

FIG. 2 is an equivalent circuit diagram of a memory cell array in which the memory cells of FIG. 1 are arranged in the form of a matrix.

As shown in FIG. 2, the upper electrodes 31 of the ferroelectric capacitors 30 included in the memory cells disposed on the first row are connected to a first word line WL1, and the upper electrodes 31 of the ferroelectric capacitors 30 included in the memory cells disposed on the second row are connected to a second word line WL2. The drain regions 11 of the reading FETs 10 included in the memory cells in the first column are connected to a first bit line BL1, and the drain regions 11 of the reading FETs 10 included in the memory cells disposed in the second column are connected to a second bit line BL2. The source regions 12 of the reading FETs 10 included in the memory cells disposed on the first row are connected to a first plate line CP1, and the source regions 12 of the reading FETs 10 included in the memory cells disposed on the second row are connected to a second plate line CP2. The gate electrodes 23 of the selecting FETs 20 included in the memory cells disposed in the first column are connected to a first control line BS1, and the gate electrodes 23 of the selecting FETs 20 included in the memory cells disposed in the second column are connected to a second control line BS2.

Now, the method for driving the semiconductor memory of Embodiment 1 will be described. (Data write operation)

A data is written in the semiconductor memory of this embodiment as follows:

With the substrate potential set to a ground voltage, a voltage of 0 V is applied to all the signal lines including the word line WL, the bit line BL, the plate line CP and the control line BS. Thereafter, a positive writing voltage (first writing voltage) or a negative writing voltage (second writing voltage) is applied to the word line WL, so as to cause downward or upward polarization in the ferroelectric film 33 of the ferroelectric capacitor 30. Herein, a state where the downward polarization is caused in the ferroelectric film 33 is defined as a data "1" and a state where the upward polarization is caused in the ferroelectric film 33 is defined as "0".

Figure 3:
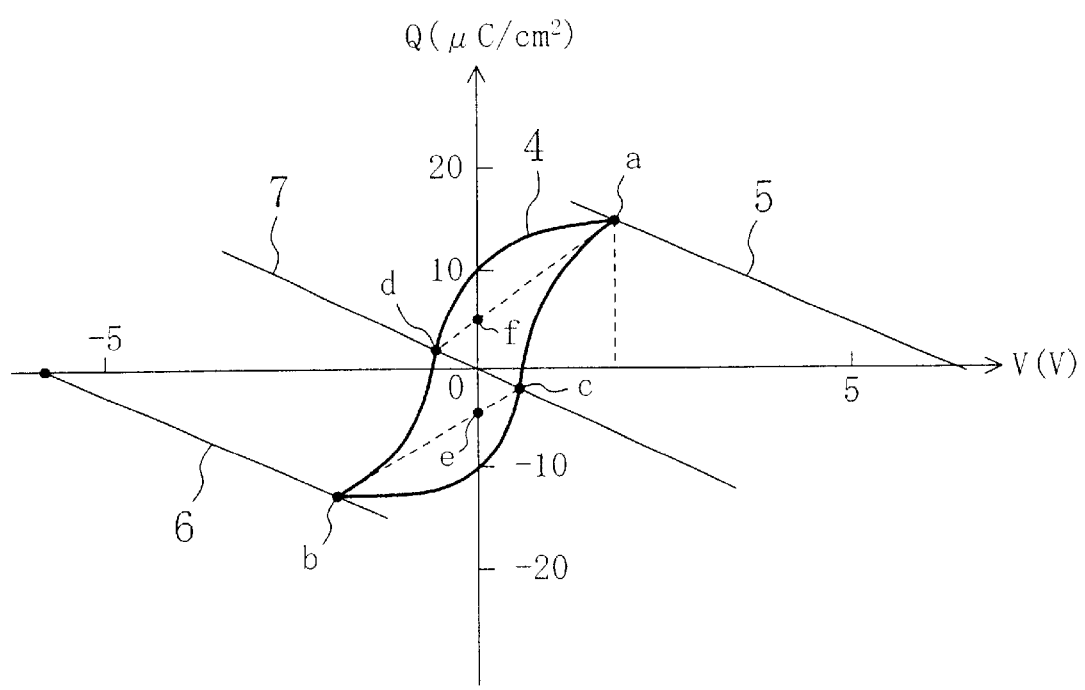
FIG. 3 is a diagram for illustrating behavior of charge and voltage in a read operation of the semiconductor memory of Embodiment 1.

Now, the relationship between charge Q (indicated by the ordinate) and voltage V (indicated by the abscissa) in a write operation will be described with reference FIG. 3. In FIG. 3, a reference numeral 4 denotes a hysteresis loop obtained in data write, a reference numeral 5 denotes a first gate capacitance load line obtained in writing a data "1", a reference numeral 6 denotes a second gate capacitance load line obtained in writing a data "0", and a reference numeral 7 denotes a third gate capacitance load line obtained when a bias voltage is 0 V.

For example, when the potential of the word line WL is set to 6 V (the first writing voltage), the magnitude of the polarization of the ferroelectric film 33 of the ferroelectric capacitor 30 corresponds to an upper end point a of the hysteresis loop 4, and when the potential of the word line WL is set to −6 V (the second writing voltage), the magnitude of the polarization of the ferroelectric film 33 of the ferroelectric capacitor 30 corresponds to a lower end point b of the hysteresis loop 4.

When a write operation is completed, the potential of the word line WL is set to 0 V. Thus, in the case where a data "1" (corresponding to downward polarization) is stored, the potential of the gate electrode 13 of the reading FET 10 corresponds to a first intersection c between the hysteresis loop 4 and the third gate capacitance load line 7, which has positive potential. In the case where a data "0" (corresponding to upward polarization) is stored, the potential of the gate electrode 13 of the reading FET 10 corresponds to a second intersection d between the hysteresis loop 4 and the third gate capacitance load line 7, which has negative potential.

Next, the potential of the control line BS is increased to exceed the threshold voltage of the selecting FET 20, so as to turn on the selecting FET 20. Thus, the potential of both the upper electrode 31 and the lower electrode 32 of the ferroelectric capacitor 30 becomes 0 V, namely, a potential difference between the upper electrode 31 and the lower electrode 32 is removed. Therefore, in the case where a data "1" is stored, the potential of the gate electrode 13 of the reading FET 10 moves from the first intersection c to a first point e on the ordinate, and in the case where a data "0" is stored, the potential of the gate electrode 13 of the reading FET 10 moves from the second intersection d to a second point f on the ordinate.

Thereafter, even when the potential of the control line BS is set to 0 V so as to turn off the selecting FET 20, since there is no potential difference between the upper electrode 31 and the lower electrode 32, the magnitude of the polarization of the ferroelectric film 33 is retained, and lowering of the potential difference through the resistance component of the ferroelectric film 33 can be avoided.

(Data Read Operation)

A data is read from the semiconductor memory of this embodiment as follows:

As described above, the selecting FET 20 is turned on after a write operation, so as to set the potential of both the upper electrode 31 and the lower electrode 32 of the ferroelectric capacitor 30 to 0 V. Therefore, as shown in FIG. 3, in the case where a data "1" is stored, the potential of the gate electrode 13 of the reading FET 10 moves from the first intersection c to the first point e on the ordinate and in the case where a data "0" is stored, the potential of the gate electrode 13 of the reading FET 10 moves from the second intersection d to the second point f on the ordinate.

Under this condition, a reading voltage of, for example, 1.5 V is applied to the word line WL of FIG. 1. In this manner, a potential difference of 1.5 V is induced between the word line WL and the substrate 14, and the potential difference is divided in accordance with the capacitance of the ferroelectric capacitor 30 and the gate capacitance of the reading FET 10. The dependency of the capacitance of the ferroelectric capacitor 30 on voltage is varied depending upon the polarization direction of the ferroelectric film 33, namely, whether the stored data is "1" or "0". This will now be described with reference to FIG. 4.

Figure 4:
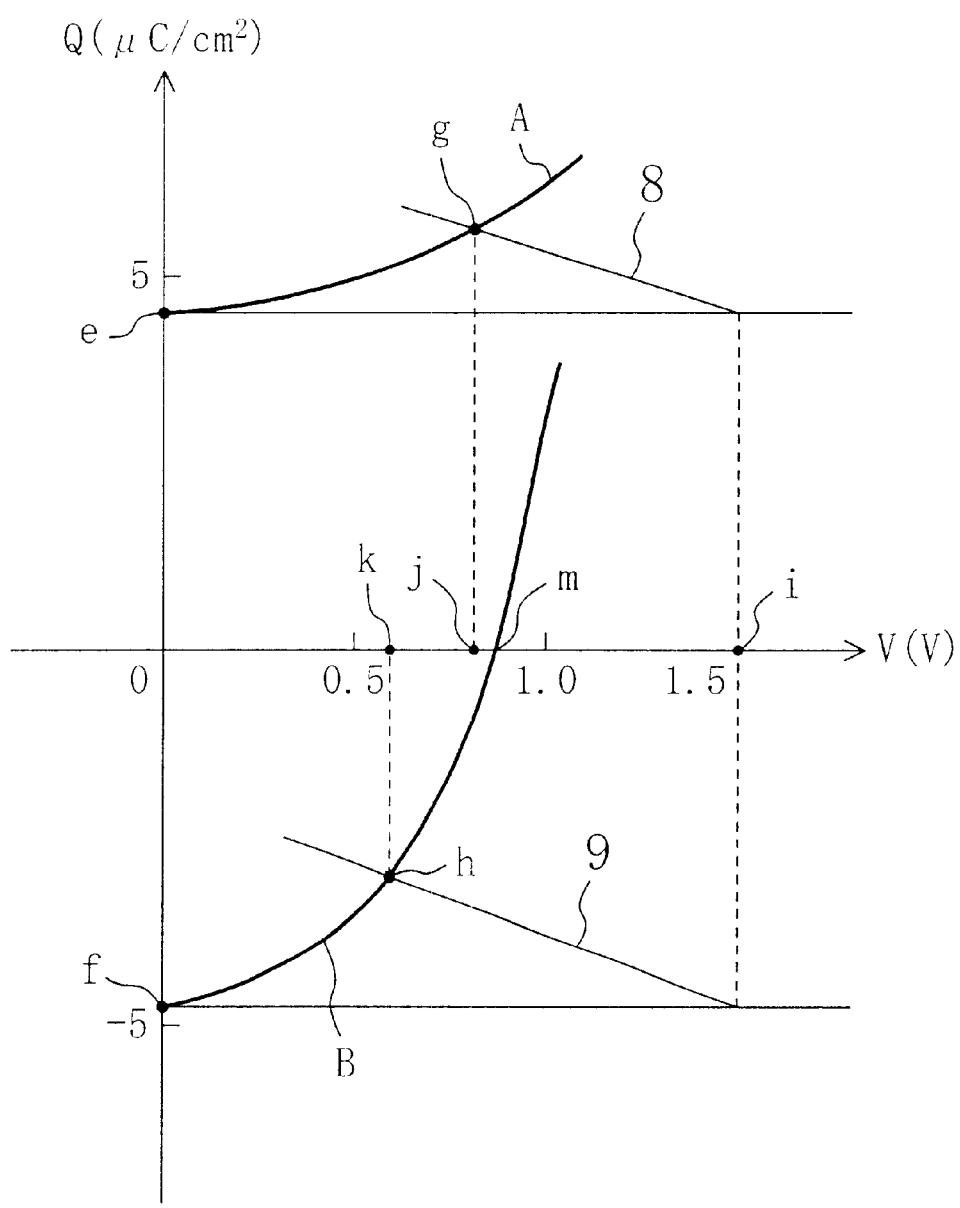
FIG. 4 is another diagram for illustrating behavior of charge and voltage in a read operation of the semiconductor memory of Embodiment 1.

In assuming a point for keeping the polarization to be the origin and the gate capacitance to be a load line, a state where a reading voltage of 1.5 V is applied to the word line WL is equivalent to the load line crossing the voltage axis (abscissa) at a point of 1.5 V. This is equivalent to giving a fourth gate capacitance load line 8 with respect to a data "1" and giving a fifth gate capacitance load line 9 with respect to a data "0" as shown in FIG. 4.

When a voltage is applied to the word line WL, a voltage is also applied to the ferroelectric capacitor 30. Therefore, in the case where the word line WL has potential of 1.5 V, the polarization is changed along a first curve A when the data is "1" so as to be balanced at an intersection g between the first curve A and the fourth gate capacitance load line 8, and the polarization is changed along a second curve B when the data is "0" so as to be balanced at an intersection h between the second curve B and the fifth gate capacitance load line 9.

Intersections i, j and k determine the distribution of potential in the respective polarized states. When the stored data is "1", a voltage of approximately 0.7 V between the intersection i and the intersection j is distributed as the gate potential of the reading FET 10, and when the stored data is "0", a voltage of approximately 0.9 V between the intersection i and the intersection k is distributed as the gate potential of the reading FET 10.

Accordingly, when the threshold voltage of the reading FET 10 is set to 0.8 V corresponding to an intermediate value between 0.7 V and 0.9 V, the reading FET 10 is in an off-state in reading a data "1" and is in an on-state in reading a data "0".

Therefore, when a potential difference is induced between the plate line CP and the bit line BL of FIG. 1, no current flows through the reading FET 10 when a data "1" is stored and a current flows through the reading FET 10 when a data "0" is stored. Accordingly, it can be determined whether the stored data is "1" or "0" by detecting whether a current flowing through the reading FET 10 is small or large with separately provided current detection means.

In this read operation, when the stored data is "1", the application of the reading voltage to the word line WL enhances the polarization but when the stored data is "0", the voltage application reverses the polarization. Accordingly, if a voltage applied to the ferroelectric capacitor 30 exceeds the coercive voltage thereof, the polarization is reversed. However, in this embodiment, the voltage applied to the ferroelectric capacitor 30 when the stored data is "0" is 0.6 V, which is lower than a point m corresponding to the coercive voltage. Therefore, the polarization is not reversed and there is no fear of change of a stored data.

Preferably, the reading voltage applied between the word line WL and the substrate 14 is distributed between a voltage applied between the upper electrode 31 and the lower electrode 32 of the ferroelectric capacitor 30 and a voltage applied between the gate electrode 13 of the reading FET 10 and the substrate 14 by adjusting the capacitance of the ferroelectric capacitor 30 and the gate capacitance of the reading FET 10, so that the voltage applied to the ferroelectric capacitor 30 can be set to a value not exceeding the coercive voltage of the ferroelectric capacitor 30, namely, a value for not reversing the polarization.

As described so far, as characteristics of Embodiment 1, the reading voltage (1.5 V) has the same polarity as the first writing voltage (+6 V) applied in writing a data "1", and is set to such magnitude that, in applying the reading voltage, a first potential difference (approximately 0.7 V) induced between the gate electrode 13 and the substrate 14 when a data "1" is stored is smaller than a second potential difference (approximately 0.9 V) induced between the gate electrode 13 and the substrate 14 when a data "0" is stored.

In this manner, even when a potential difference between the upper electrode 31 and the lower electrode 32 of the ferroelectric capacitor 30 is zero, a data written in the ferroelectric capacitor 30 can be definitely read.

A difference between the method for driving the semiconductor memory of this embodiment and the conventional method for driving a semiconductor memory will now be described.

In the conventional method, when a data "1" is written, the reading FET 10 is turned on by setting the positive potential induced in the gate electrode 13 to be higher than the threshold voltage of the reading FET 10, and the FET 10 is kept in an on-state after the data write. In reading the data, a potential difference is induced between the drain region 11 and the source region 12 of the reading FET 10, so as to read a current value of a current flowing between the drain region 11 and the source region 12.

Also, when a data "0" is written, the reading FET 10 is turned off because the negative potential induced in the gate electrode 13 is lower than the threshold voltage of the reading FET 10, and the reading FET 10 is kept in an off-state after the data write. In reading the data, a potential difference is induced between the drain region 11 and the source region 12 of the reading FET 10, so as to read a current value of no current flowing between the drain region 11 and the source region 12 of the reading FET 10 in an off-state.

Accordingly, in the conventional method, the potential induced in the gate electrode 13 in writing a data "1" is higher than the potential induced in the gate electrode 13 in writing a data "0", the potential induced in the gate electrode 13 in storing a data "1" is higher than the potential induced in the gate electrode 13 in storing a data "0", and the potential induced in the gate electrode 13 in reading a data "1" is higher than the potential induced in the gate electrode 13 in reading a data "0". In other words, the potential of the gate electrode 13 in writing, storing and reading a data "1" is always higher than the potential of the gate electrode 13 in writing, storing and reading a data In contrast, in Embodiment 1, although the potential induced in the gate electrode 13 in writing a data "1" is higher than the potential induced in the gate electrode 13 in writing a data "0", the potential of the gate electrode 13 in storing a data is zero whether the data is "1" or "0", and the potential induced in the gate electrode 13 in reading a data "1" is lower than the potential induced in the gate electrode 13 in reading a data "0".

Embodiment 2

A semiconductor memory and a method for driving the semiconductor memory according to Embodiment 2 of the invention will now be described with reference to FIG. 5.

Figure 5:
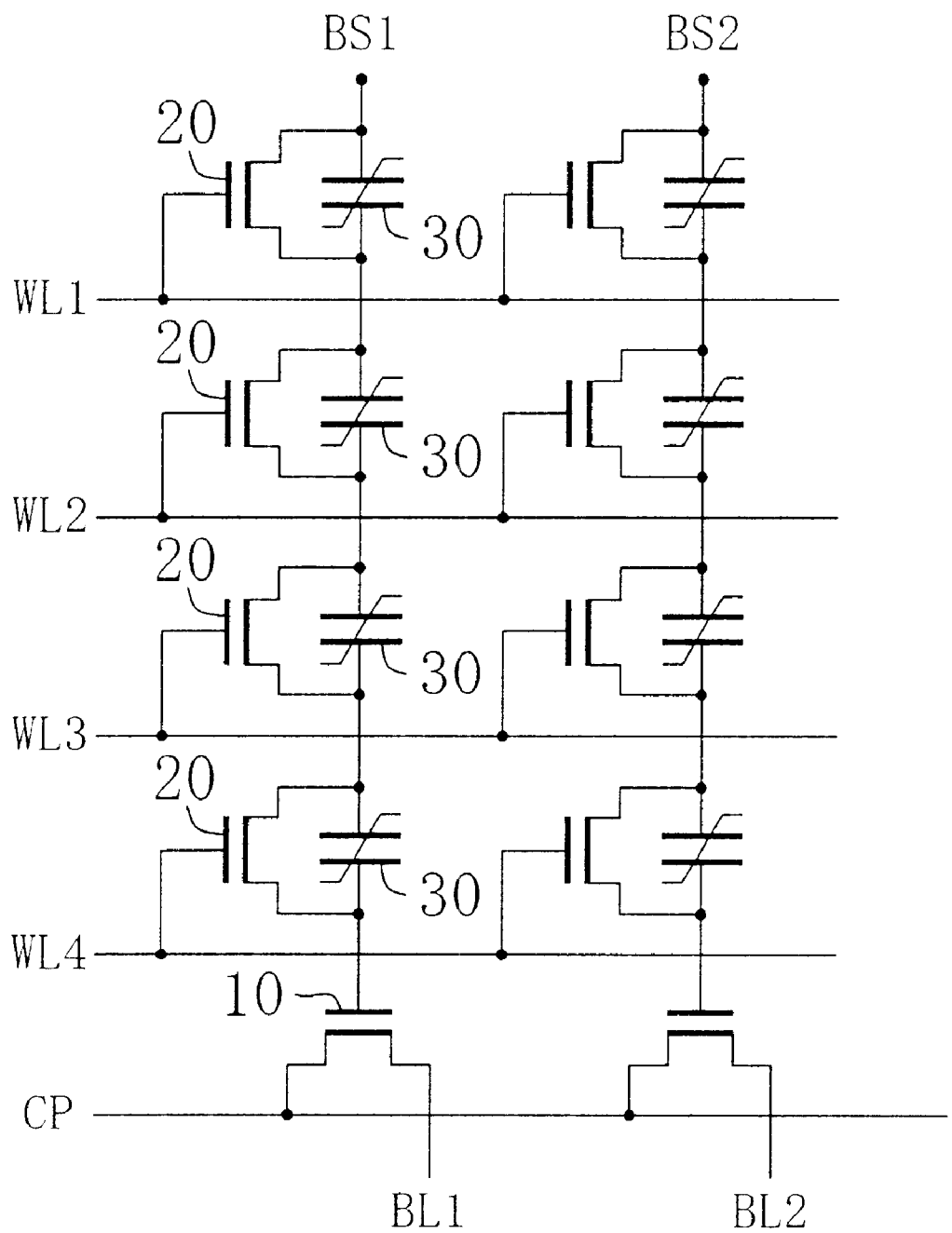
FIG. 5 is an equivalent circuit diagram of a memory cell array of a semiconductor memory according to Embodiment 2 of the invention.
Figure 6:
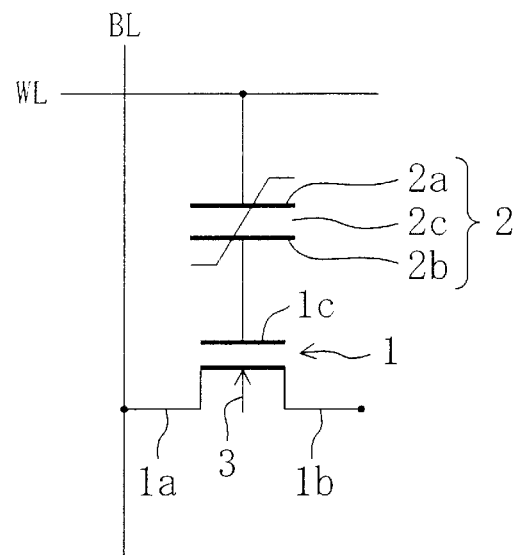
FIG. 6 is an equivalent circuit diagram of a memory cell included in a conventional semiconductor memory.
Figure 7:
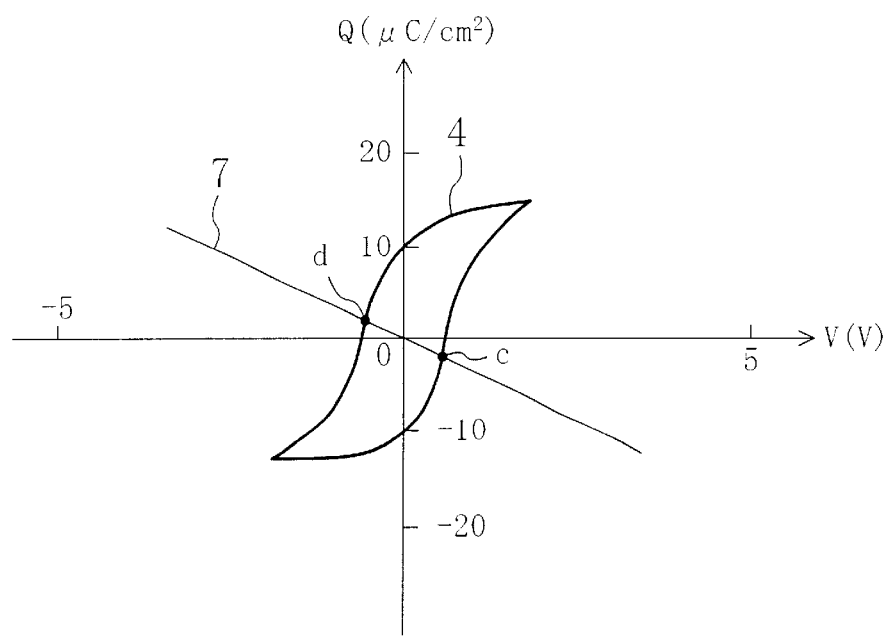
FIG. 7 is a diagram for illustrating behavior of charge and voltage in a read operation of the conventional semiconductor memory.

As shown in FIG. 5, a plurality of memory cells each including a ferroelectric capacitor 30 and a selecting FET 20 connected to each other in parallel similarly to Embodiment 1 are successively connected to one another, and a reading FET is connected to one end of each bit column including the plural successively connected ferroelectric capacitors 30. Also, a plurality of bit columns each including the plural ferroelectric capacitor 30 are provided along the row direction, so as to form a memory cell array.

The reading FET 10, the selecting FET 20 and the ferroelectric capacitor 30 of Embodiment 2 have the same structures as those of Embodiment 1.

As shown in FIG. 5, a first word line WL1 is connected to the gate electrode of the selecting FET 20 included in each memory cell on the first row, a second word line WL2 is connected to the gate electrode of the selecting FET 20 included in each memory cell on the second row, and a third word line WL3 and a fourth word line WL4 are similarly connected.

The first bit column including the plural ferroelectric capacitors 30 is connected to a first control line BS1 at one end thereof and to the gate electrode of the reading FET 10 at the other end thereof, and the drain region of the reading FET 10 is connected to a first bit line BL1. Also, the second bit column including the plural ferroelectric capacitors 30 is connected to a second control line BS2 at one end thereof and to the gate electrode of the corresponding reading FET 10 at the other end thereof, and the drain region of this reading FET 10 is connected to a second bit line BL2. Furthermore, the source regions of the reading FETs 10 in the first and second columns are commonly connected to a plate line CP.

In Embodiment 2, in selecting, for example, a memory cell on the first row and in the first bit column connected to the first control line BS1, the potential of the first word line WL1 is set to an L level and the potential of the second through fourth word lines WL2 through WL4 are set to an H level, so that the upper electrodes and the lower electrodes of the ferroelectric capacitors 30 on the second through fourth rows are short-circuited. In this manner, the ferroelectric capacitor 30 included in the memory cell in the first bit column and on the first row is serially connected to the reading FET 10 in the first bit column. This semiconductor memory is thus equivalent to that of Embodiment 1.

Accordingly, a data write operation, a data read operation and an operation after data read are carried out in the same manner as in Embodiment 1, resulting in attaining the same effect as that of Embodiment 1.

In each of Embodiments 1 and 2, change of the potential of the gate electrode of the reading FET 10 depending upon whether a stored data is "1" or "0" is utilized in a read operation so that logical decision can be made on the basis of the modulation of the reading FET 10. Instead, the gate voltage of the reading FET 10 may be introduced to a sense amplifier so as to be compared with a reference voltage or to amplify a voltage difference between the gate voltage and a reference voltage for the logical decision.

What is claimed is:

1. A method for driving a semiconductor memory including a ferroelectric capacitor for storing a multi-valued data in accordance with displacement of polarization of a ferroelectric film thereof and a reading field effect transistor that is formed on a substrate and has a gate electrode connected to a first electrode corresponding to one of an upper electrode and a lower electrode of said ferroelectric capacitor for detecting the displacement of the polarization of said ferroelectric film, comprising:

a first step of writing a multi-valued data in said ferroelectric capacitor by applying a relatively high first writing voltage or a relatively low second writing voltage between said first electrode and a second electrode corresponding to the other of said upper electrode and said lower electrode of said ferroelectric capacitor;

a second step of removing a potential difference induced between said first electrode and said second electrode; and a third step of reading the multi-valued data by detecting the displacement of the polarization of said ferroelectric film by applying a reading voltage between said second electrode and said substrate, wherein said reading voltage has the same polarity as said first writing voltage and is set to such magnitude that, in applying said reading voltage, a first potential difference induced between said gate electrode and said substrate when the multi-valued data is written by applying said first writing voltage is smaller than a second potential difference induced between said gate electrode and said substrate when the multi-valued data is written by applying said second writing voltage.

2. The method for driving a semiconductor memory of claim 1, wherein said semiconductor memory has a switch for equalizing potentials of said first electrode and said second electrode of said ferroelectric capacitor, and the second step includes a sub-step of removing the potential difference by equalizing the potentials of said first electrode and said second electrode with said switch.

3. The method for driving a semiconductor memory of claim 1, wherein the third step includes a sub-step of detecting the displacement of the polarization of said ferroelectric film by detecting whether a potential difference induced between said gate electrode and said substrate owing to division of said reading voltage in accordance with a ratio between capacitance of said ferroelectric capacitor and gate capacitance of said reading field effect transistor is relatively high or relatively low.

4. A method for driving a semiconductor memory including a plurality of successively connected ferroelectric capacitors each for storing a multi-valued data in accordance with displacement of polarization of a ferroelectric film thereof, and a reading field effect transistor that is formed on a substrate and has a gate electrode connected to one end of said plurality of successively connected ferroelectric capacitors for detecting the displacement of the polarization of said ferroelectric film of each of said successively connected ferroelectric capacitors, comprising:

a first step of writing a multi-valued data in one ferroelectric capacitor selected from said plurality of ferroelectric capacitors by applying a relatively high first writing voltage or a relatively low second writing voltage between an upper electrode and a lower electrode of said selected ferroelectric capacitor;

a second step of removing a potential difference induced between said upper electrode and said lower electrode of said selected ferroelectric capacitor; and a third step of reading the multi-valued data by detecting the displacement of the polarization of said ferroelectric film of said selected ferroelectric capacitor by applying a reading voltage between another end of said plurality of successively connected ferroelectric capacitors and said substrate, wherein said reading voltage has the same polarity as said first writing voltage and is set to such magnitude that, in applying said reading voltage, a first potential difference induced between said gate electrode and said substrate when the multi-valued data is written by applying said first writing voltage is smaller than a second potential difference induced between said gate electrode and said substrate when the multi-valued data is written by applying said second writing voltage.

5. The method for driving a semiconductor memory of claim 4, wherein said semiconductor memory has a plurality of switches each for equalizing potentials of an upper electrode and a lower electrode of each of said plurality of ferroelectric capacitors, and the second step includes a sub-step of removing the potential difference by equalizing the potentials of said upper electrode and said lower electrode of said selected ferroelectric capacitor with said switch.

6. The method for driving a semiconductor memory of claim 4, wherein the third step includes a sub-step of detecting the displacement of the polarization of said ferroelectric film of said selected ferroelectric capacitor by detecting whether a potential difference induced between said gate electrode and said substrate owing to division of said reading voltage in accordance with a ratio between capacitance of said selected ferroelectric capacitor and gate capacitance of said reading field effect transistor is relatively high or relatively low.

* * * * *